United States Patent
Yeung et al.

(10) Patent No.: US 8,212,587 B2
(45) Date of Patent: Jul. 3, 2012

(54) REDRIVER WITH OUTPUT RECEIVER DETECTION THAT MIRRORS DETECTED TERMINATION ON OUTPUT TO INPUT

(75) Inventors: Tony Yeung, Milpitas, CA (US); Michael Y. Zhang, Palo Alto, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 923 days.

(21) Appl. No.: 12/256,624

(22) Filed: Oct. 23, 2008

(65) Prior Publication Data

US 2010/0105319 A1  Apr. 29, 2010

(51) Int. Cl.
*H03K 19/0175* (2006.01)

(52) U.S. Cl. ............ 326/82; 326/86; 375/211; 375/229; 710/106

(58) Field of Classification Search ............. 326/30, 326/82–83, 86–87; 375/211–215, 229–236; 710/100, 105–106
See application file for complete search history.

(56) References Cited

U.S. PATENT DOCUMENTS

| | | | |
|---|---|---|---|
| 4,154,978 A | 5/1979 | Tu | |
| 5,157,635 A | 10/1992 | Ellis et al. | |
| 5,347,538 A | 9/1994 | Marbot | |
| 6,144,708 A | 11/2000 | Maruyama | |
| 6,429,665 B1 | 8/2002 | Ghoshal | |
| 6,756,790 B2 | 6/2004 | Yakabe et al. | |
| 7,009,827 B1 | 3/2006 | Lee et al. | |
| 7,196,540 B2 | 3/2007 | Ueno | |
| 7,368,936 B2 | 5/2008 | Huang | |
| 2002/0130680 A1 | 9/2002 | Meyer et al. | |
| 2004/0222834 A1* | 11/2004 | Frans et al. | 327/165 |
| 2006/0129733 A1* | 6/2006 | Sobelman | 710/305 |
| 2007/0008035 A1* | 1/2007 | Liu et al. | 330/253 |
| 2008/0082706 A1 | 4/2008 | Buckland et al. | |

OTHER PUBLICATIONS

Pericom, "PI2EQX5804", Data Sheet, Aug. 7, 2008, pp. 1-22.
Pericom, "PI2EQX5864", Data Sheet, Aug. 7, 2008, pp. 1-19.

* cited by examiner

*Primary Examiner* — Shawki S Ismail
*Assistant Examiner* — Jany Tran
(74) *Attorney, Agent, or Firm* — Stuart T. Auvinen; gPatent LLC

(57) ABSTRACT

A redriver chip is inserted between a transmitter chip and a receiver chip and re-drives differential signals from the transmitter chip to the receiver chip. The redriver chip has switched output termination that switches to a high value to detect far-end termination at the receiver chip, and to a low value for signaling. An output detector detects when the receiver chip has termination to ground and enables switched input termination to provide termination to ground on the lines back to the transmitter chip so that the far-end termination on the receiver chip is mirrored back to the transmitter chip, hiding the redriver chip. An input signal detector detects when the transmitter chip begins signaling and enables an equalizer, limiter, pre-driver, and output stage to re-drive the signals to the receiver chip. The input signal detector also causes the switched output termination to switch to the low value termination for signaling.

17 Claims, 6 Drawing Sheets

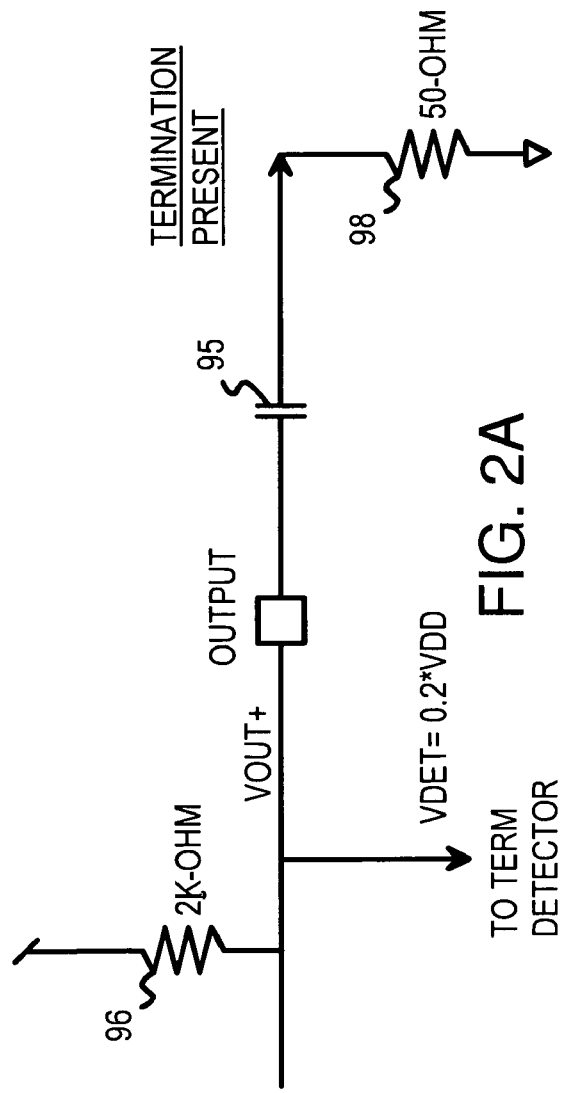
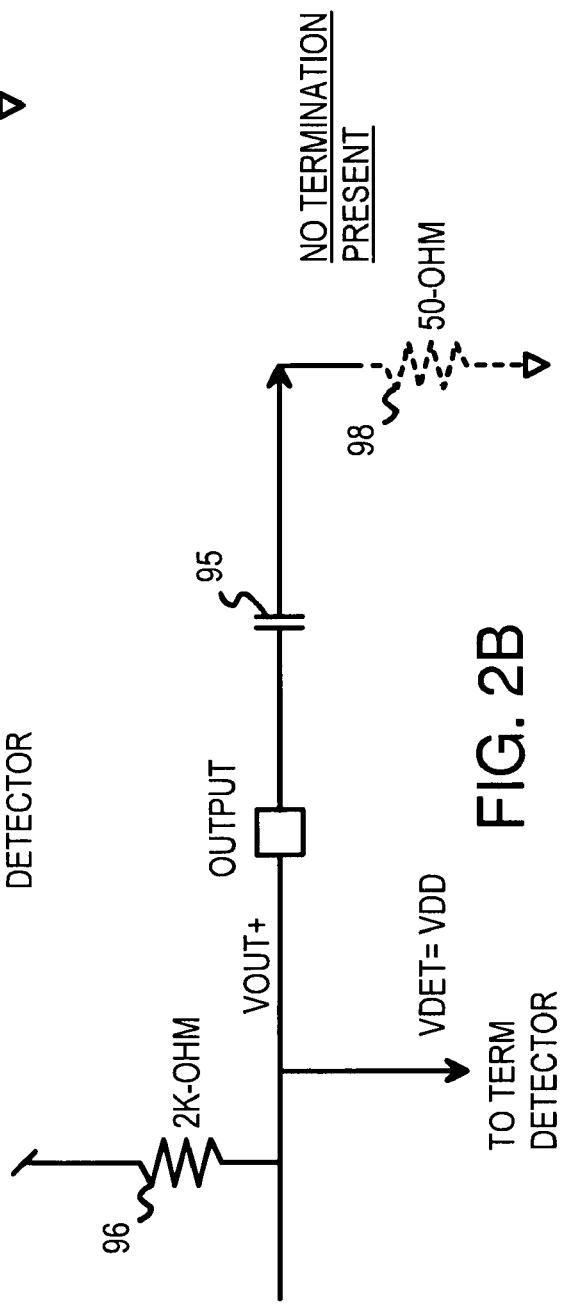

US 8,212,587 B2

REDRIVER WITH OUTPUT RECEIVER DETECTION THAT MIRRORS DETECTED TERMINATION ON OUTPUT TO INPUT

FIELD OF THE INVENTION

This invention relates to semiconductor re-driver integrated circuits, and more particularly to termination detection and reflection.

BACKGROUND OF THE INVENTION

Signal repeater and re-driver circuits are used in networking, communication, computer, and a variety of other systems. Upstream chips may have a limited drive capability, limiting the distance that signals may be safely driven. Standards such as Peripheral Components Interconnect Express (PCIE) and others may specify a limit to the length of a signal line. A long distance line may be divided into two or more segments, with a buffer or repeater between segments.

A buffer chip may be used to receive the signal from a first segment, regenerate the signal, and output the signal to the next segment. A wide variety of simple buffer chips are available. However, modern signals are often differential, small-voltage-swing signals. Buffers must not distort the signal's characteristics. Thus specialized differential buffers may be needed that are very sensitive to small-swing signals.

Signal lines are often provided with termination to improve signal characteristics. For example, the far end of a transmission line that is near the receive may have a resistor to ground, with the near end of the transmission line may have a termination resistor to power. The two resistors set the voltage of the transmission line to an intermediate voltage between power and ground when no signals are being transmitted. The termination resistors absorb injected noise on the transmission line and reduce or prevent large voltage swings from occurring. The A.C. characteristics of the transmission line at a desired signaling frequency may be enhanced by tuning the values of the termination. The exact values of termination resistors may be determined empirically by soldering different-value termination resistors into a test board and selecting the resistor value that produces the best characteristics.

One problem with re-driver circuits is that the termination may change during operation. At times, some lanes of differential signals may be powered-down and their termination disconnected to save power. A simple buffer chip used as a re-driver that is inserted between a pair of line segments may block the chip that transmits to the first segment from seeing the change in termination of the last segment. The transmitting chip may be prevented from powering down by the buffer chip.

What is desired is a re-driver integrated circuit that is designed for repeating differential small-swing signals. A re-driver that senses far-end termination on a next segment that is driven by the redriver is desirable. A re-driver chip that senses far-end termination on its output and mirrors that termination back to its input is desirable. A re-driver chip that also shapes, amplifies, and equalizes signals to improve signal characteristics is also desirable.

BRIEF DESCRIPTION OF THE DRAWINGS

FIGS. 2A, 2B highlight sensing of far-end termination on the output lines of the redriver chip.

DETAILED DESCRIPTION

The present invention relates to an improvement in re-driver termination sensing and mirroring. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that a buffer chip that re-drives a signal from a first segment to a second segment may prevent a transmitter chip on the first segment from detecting power-down of a receiver chip on the second segment. An intelligent re-driver chip is needed.

Figure 1:
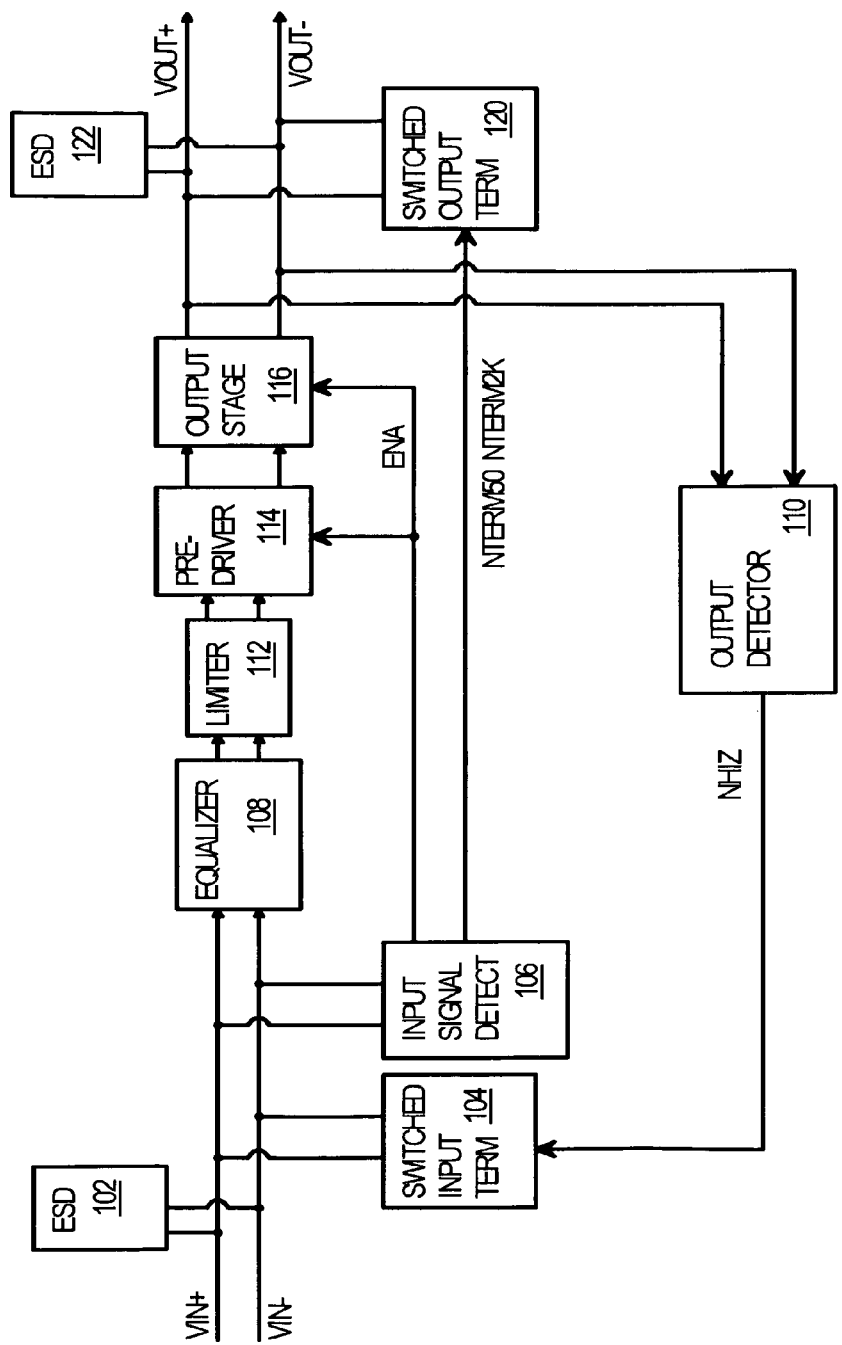
FIG. 1 is a block diagram of a re-driver chip that detects far-end termination on its output and mirrors that termination to its input.

FIG. 1 is a block diagram of a re-driver chip that detects far-end termination on its output and reflects or mirrors that termination to its input. Differential input VIN+, VIN− are differential small-swing signals that are sent by an upstream transmitter chip over a first segment. The upstream transmitter chip may be a Peripheral Components Interconnect Express (PCIE) transmitter, or may use another bus standard.

Differential output VOUT+, VOUT− are differential small-swing signals that are re-generated by the redriver chip and sent over a second segment to a receiver chip, such as a PCIE receiver. During signaling, VOUT+, VOUT− are generated from VIN+, VIN− with a small time delay. During signaling, the pair of lines in a differential signal swing in opposite directions, but when signaling is turned off, such as when a lane is powered down, the pair of signals may both be driven to a same voltage, such as the power-supply voltage VDD.

To protect the internal transistors from damage from small electrical shocks, such as during handling, electro-static-discharge (ESD) protection circuit 102 is connected to inputs VIN+, VIN−. ESD protection circuit 122 is connected to outputs VOUT+, VOUT−. ESD protection circuits 102, 122 may contain a variety of structures designed to shunt current away from internal circuitry and to internal power and ground buses. For example, high-current reverse-biased diodes may be used.

Inputs VIN+, VIN− are applied to equalizer 108, which can be adjustable such as by programming parameters into programmable registers (not shown). Equalizer 108 can provide pre-emphasis or de-emphasis of signal pulses to alter the shape of pulses to remove pulse distortions that were caused by transmission over the first segment. Higher-frequency signal components may be attenuated or enhanced as necessary relative to lower-frequency signal components.

After equalization, the signal from equalizer 108 is limited by limiter 112. Limiter 112 can clip signals that are over a limit voltage. Thus extreme voltage swings can be removed without distorting other parts of the signal.

Limiter 112 sends the clipped signal to pre-driver 114. Pre-driver 114 buffers the clipped signal and may perform a voltage shift or some amplification. Output stage 116 receives the signals from pre-driver 114 and provides large-current drive to outputs VOUT+, VOUT−.

Input signal detector 106 senses when VIN+, VIN− are carrying a signal from the upstream transmitter. When a signal is detected on VIN+, VIN−, input signal detector 106 enables pre-driver 114 and output stage 116, so that the input signal on VIN+, VIN− is re-driven onto VOUT+, VOUT−.

When no signal is detected on VIN+, VIN− by input signal detector 106, input signal detector 106 disables pre-driver 114 and output stage 116. Power consumption is reduced.

When input signal detector 106 detects an input signal on VIN+, VIN−, it also sends a control signal to switched output termination 120. Switched output termination 120 provides either a 50-ohm termination to VDD, or a 2K-ohm termination to VDD in response to control signals from input signal detector 106. Initially the control signals instruct switched output termination 120 to provide the 2K-ohm termination to VDD so that output detector 110 can sense the far-end termination on VOUT+, VOUT− that is provided by the downstream receiver. Once sensing is complete, the control signals from input signal detector 106 instruct switched output termination 120 to provide the 50-ohm to VDD termination during signaling. When the input signaling pauses or stops, input signal detector 106 instructs switched output termination 120 to replace the 50-ohm to VDD termination with the 2K-ohm termination to VDD, thus reducing power consumption without completely powering down.

Output detector 110 senses VOUT+, VOUT− to determine when the receive chip has connected termination to VOUT+, VOUT−. When far-end termination is detected, output detector 110 commands switched input termination 104 to install termination on VIN+, VIN−. Thus the termination present on the far-end of VOUT+, VOUT− is mirrored back to the transmitter at the beginning of the segment for VIN+, VIN−. This mirroring of far-end termination back to the transmitter allows the far-end receiver to signal the transmitter to power down, or to indicate a readiness to begin receiving data. The insertion of the re-driver chip in FIG. 1 between the receiver and the transmitter does not block this ready/power-down signaling from occurring.

When no termination is sensed by output detector 110 on VOUT+, VOUT−, output detector 110 activates the HIZ control signal to switched input termination 104, causing switched input termination 104 to not connect any termination to VIN+, VIN−. The re-driver chip then provides a high-impedance VIN+, VIN− segment to the transmitter chip, just as the receiver chip provided a high-impedance (hi-Z) segment to the re-driver chip.

When input signal detector 106 detects signaling on VIN+, VIN−, it first activates the NTERM2K signal, causing switched output termination 120 to switch the 2K to VDD termination onto VOUT+, VOUT−, and allowing output detector 110 to sense the output termination. After a short sensing time period, input signal detector 106 activates the NTERM50 signal, causing switched output termination 120 to switch the 50-ohm to VDD termination onto VOUT+, VOUT, and activating signal ENA to enable pre-driver 114 and output stage 116 to repeat the input signal on VIN+, VIN− to VOUT+, VOUT−.

FIGS. 2A, 2B highlight sensing of far-end termination on the output lines of the redriver chip. During termination sensing, NTERM2K is activated, causing switched output termination 120 to connect termination resistor 96 between VDD and output line VOUT+. Another resistor (not shown) provides similar termination to VOUT−.

In FIG. 2A, far-end termination resistor 98 is present and connected to VOUT+ at the far-end receiver. The re-driver chip's termination resistor 96 charges coupling capacitor 95. However, this charging is slow, since the other end of coupling capacitor 95 is connected to ground through far-end termination resistor 98. Output detector 110 detects this slowed charging by the slow rise in voltage of VOUT+.

In FIG. 2B, far-end termination resistor 98 is not present or is disconnected from VOUT+ at the far-end receiver. The re-driver chip's termination resistor 96 charges coupling capacitor 95. This charging is rapid, since the other end of coupling capacitor 95 is floating. Output detector 110 detects this fast charging by the fast rise in voltage of VOUT+.

For example, after a predetermined amount of sensing time, output detector 110 compared the voltage on VOUT+ to a reference voltage such as VDD/2. In FIG. 2A, far-end termination resistor 98 slows charging so that VOUT+ is only 0.2*VDD, which is below VDD/2. In FIG. 2A, the absence of far-end termination resistor 98 speeds up charging so that VOUT+ is VDD, which is above VDD/2. Output detector 110 senses VOUT+ to determine when far-end termination resistor 98 is present or not. Coupling capacitor 95 prevents D.C. current flow on the true line between the redriver device and the remote receiver chip. Another coupling capacitor is present on the complement line of the differential pair.

Figure 3:
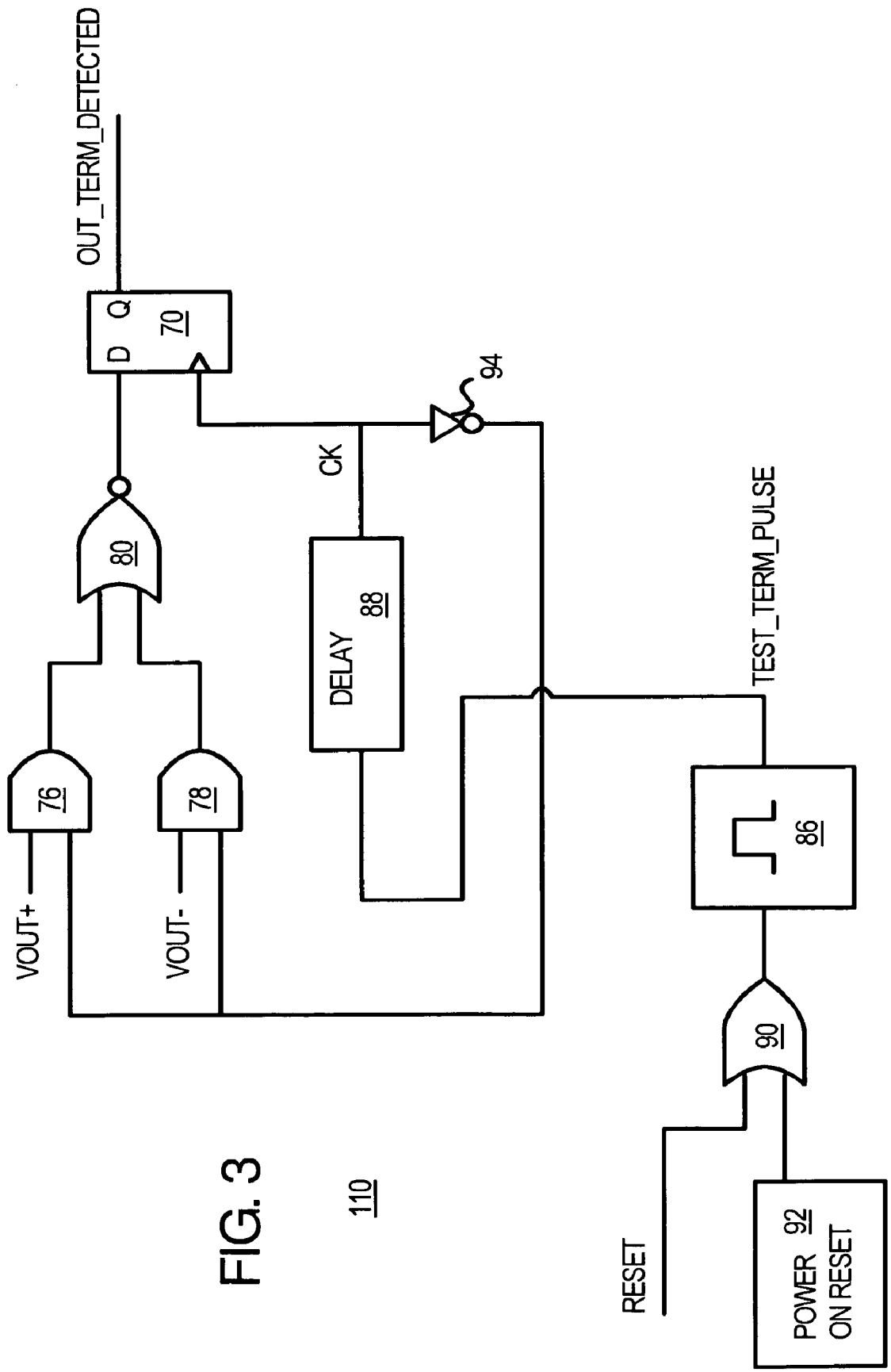
FIG. 3 is a simplified diagram of the output detector that senses far-end termination at the receiver.

FIG. 3 is a simplified diagram of the output detector that senses far-end termination at the receiver. Additional control circuits and buffering may be present in output detector 110 in the redriver circuit, and other circuit implementations of output detector 110 are possible.

Power-on-reset circuit 92 detects when power is turned on, and drives a high pulse to OR gate 90 for a period of time after reset is detected. OR gate 90 also receives an external reset signal, allowing the user to reset the redriver and trigger termination detection without powering down the redriver chip.

When either a power-on reset or an external reset is received, OR gate 90 triggers pulse generator 86 to generate a pulse. The pulse from pulse generator 86, TEST_TERM_PULSE is input to delay line 88, which delays the pulse. This delay allows time for VOUT+, VOUT− to discharge to ground, and then let the redriver connect the 2K-ohm resistor to VDD on VOUT+, VOUT− and charge VOUT+, VOUT− back up toward VDD.

Delay line 88 outputs a clock CK to the clock input of flip-flop 70. Before the clock CK pulses high, CK is low and inverter 94 drives a high signal to AND gates 76, 78, which enables their other inputs. AND gate 76 receives VOUT+, while AND gate 78 receives VOUT−.

When far-end 50-ohm to ground termination is present on the receiver chip, charging times are slow as shown in FIG. 2A. When the 2K-ohm to VDD termination resistors are connected to VOUT+, VOUT−, after the delay time of delay line 88, VOUT+, VOUT− will both still be low in voltage. The low inputs to AND gates 76, 78 cause both AND gates 76, 78 to drive lows to the inputs of NOR gate 80, causing NOR gate 80 to drive a high to the D input of flip-flop 70. When clock CK goes high, flip-flop 70 latches in this high, driving its Q output, OUT_TERM-DETECTED, high to indicate that the far-end termination has been detected.

When far-end 50-ohm to ground termination is not present on the receiver chip, charging times are faster as shown in FIG. 2B. When the 2K-ohm to VDD termination resistors are connected to VOUT+, VOUT−, after the delay time of delay line 88, VOUT+, VOUT− will both still be high in voltage. The high inputs to AND gates 76, 78 cause both AND gates 76, 78 to drive highs to the inputs of NOR gate 80, causing NOR gate 80 to drive a low to the D input of flip-flop 70. When clock CK goes high, flip-flop 70 latches in this low, driving its Q output, OUT_TERM-DETECTED, high to indicate that the far-end termination has not been detected.

The detection signal OUT_TERM-DETECTED can be combined with other signals such as external mode or enable signals and buffered to generate NHIZ to switched input termination 104, as shown in FIG. 1. When OUT_TERM-DETECTED is high, NHIZ is high to signal switched input termination 104 to connect the 50-ohm to ground termination to inputs VIN+, VIN−, so that the detected far-end termination is mirrored to the inputs of the redriver chip.

Figure 4:
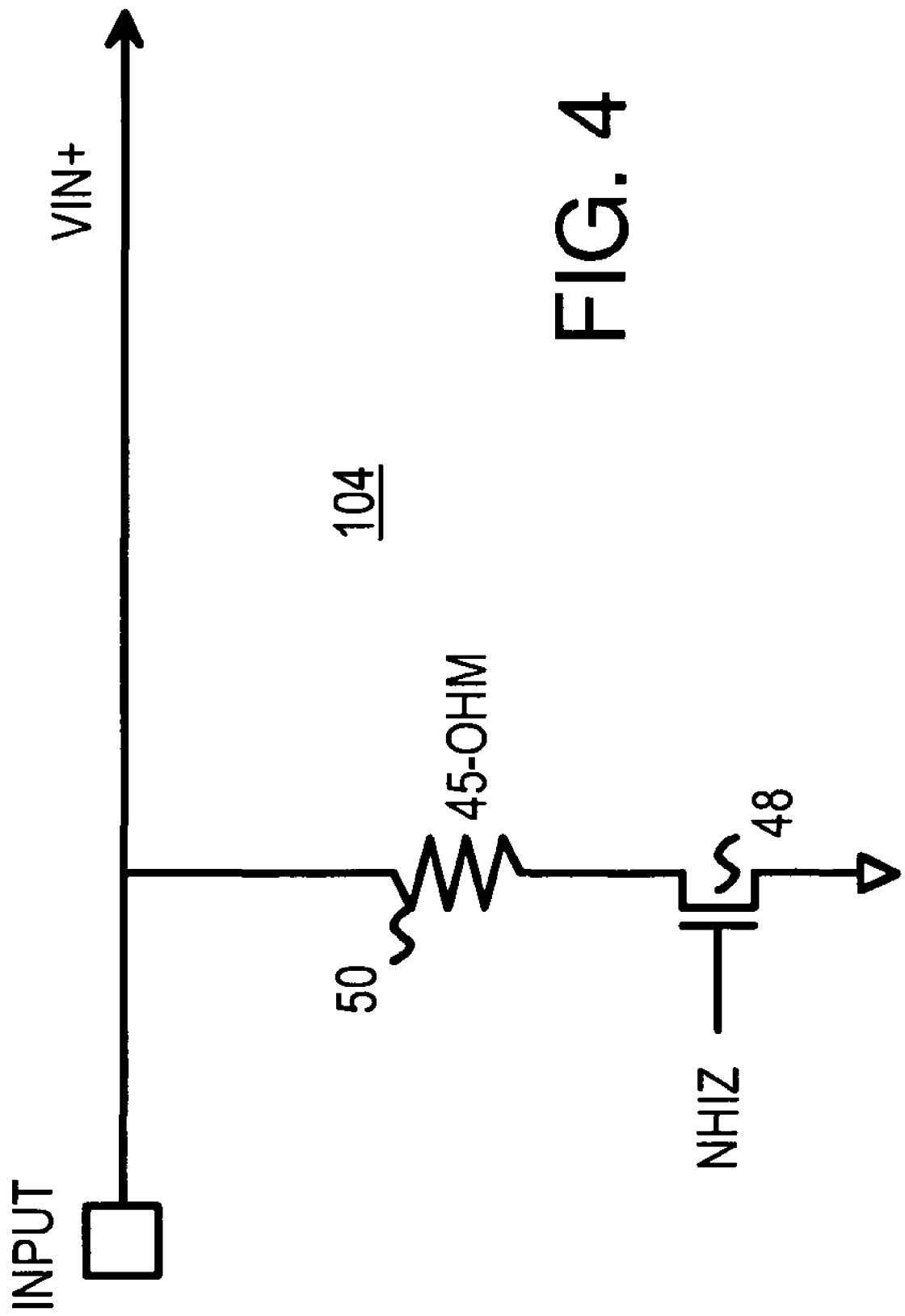
FIG. 4 shows a switched input termination circuit.

FIG. 4 shows a switched input termination circuit. Initially NHIZ is low, causing the inputs VIN+, VIN− to remain in a high-impedance state. NHIZ is driven to the gate of n-channel termination-mirror transistor 48, causing it to turn off.

When output detector 110 detects the far-end termination, it drives NHIZ high, causing n-channel termination-mirror transistor 48 to turn on. Current flows from input VIN+, through input termination-mirror resistor 50 and n-channel termination-mirror transistor 48 to ground. Since input termination-mirror resistor 50 is about 45-ohms and n-channel termination-mirror transistor 48 and internal connections are about another 5 ohms, a 50-ohm to ground termination is provide in VIN+. Another n-channel termination-mirror transistor 48 and input termination-mirror resistor 50 connect to VIN− but are not shown in this drawing.

Figure 5:
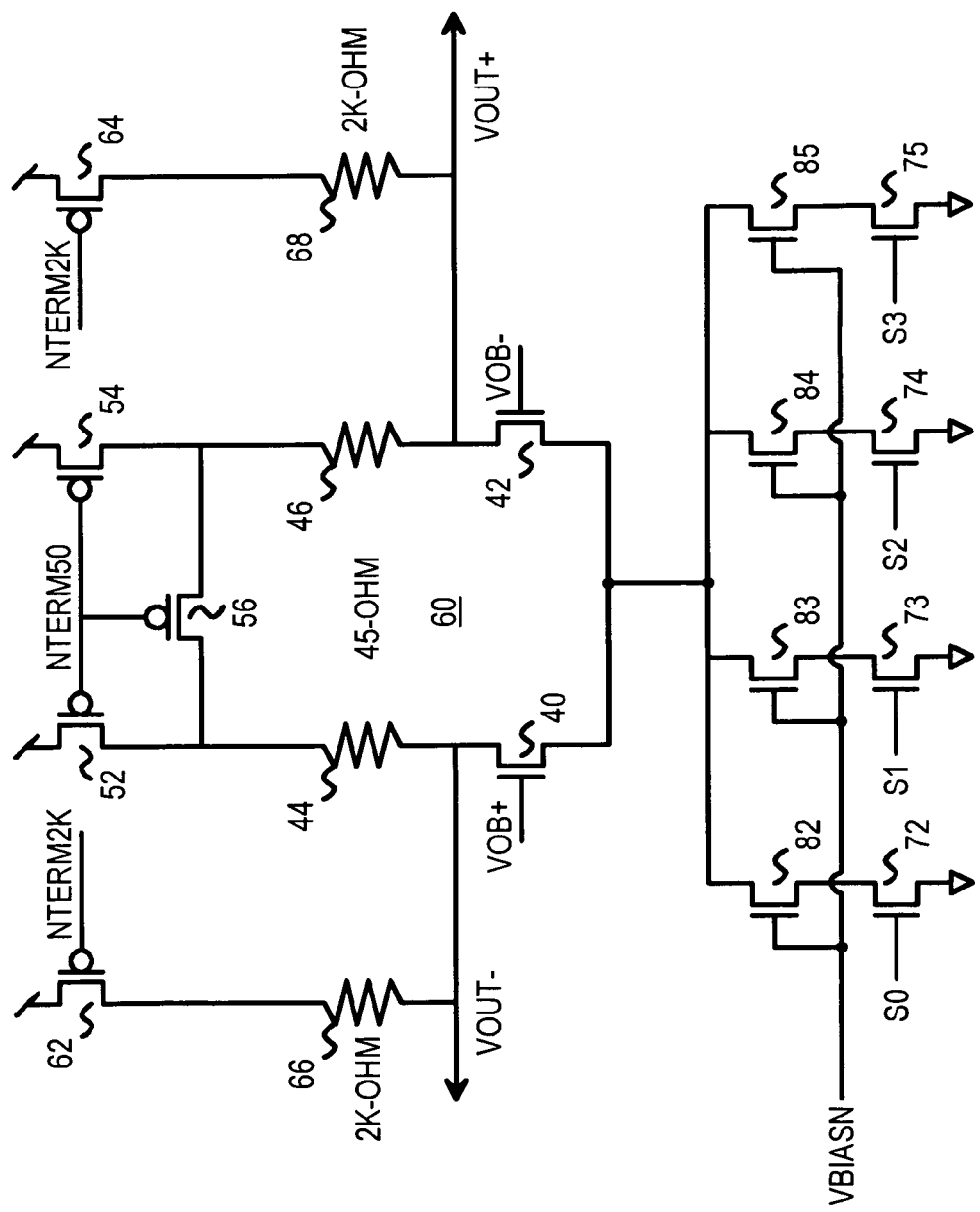
FIG. 5 is a schematic of an output stage and the switched output termination.

FIG. 5 is a schematic of an output stage and the switched output termination. Output stage 116 and switched output termination 120 of FIG. 1 are shown together in differential output circuit 60.

Initially, all termination is disabled by input signal detector 106 driving both NTERM50 and NTERM2K high, turning off p-channel termination transistors 52, 54, 62, 64. When VBIASN is also turned off, such as by enable ENA being low, outputs VOUT+, VOUT− are in a high-impedance state.

After a reset or a power-on reset, NTERM2K is driven low. Since NTERM2K is applied to the gates of p-channel termination transistors 62, 64, 2K output termination resistor 66 is connected between VOUT− and VDD by termination transistor 62. Likewise, 2K output termination resistor 68 is connected between VOUT+ and VDD by termination transistor 64. Output detector 110 can then detect the far-end termination on VOUT+, VOUT−, as shown in FIGS. 2A-B.

When the far-end termination is detected, and input signal detector 106 detect input signaling on VIN+, VIN−, input signal detector 106 drives NTERM50 low and NTERM2K high. Termination transistors 62, 64 turn off, disconnecting 2K output termination resistors 66, 68 from VOUT+, VOUT−.

The low NTERM50 is applied to the gates of p-channel termination transistors 52, 54, and to p-channel equalizing transistor 56, which all turn on. This causes 45-ohm output termination resistor 44 to be connected between VOUT− and VDD by termination transistor 52. Likewise, 45-ohm output termination resistor 46 is connected between VOUT+ and VDD by termination transistor 54. P-channel equalizing transistor 56 ensures that no slight differences occur between the drains of p-channel termination transistors 52, 54.

When input signal detector 106 detects switching on VIN+, VIN− as the upstream transmitter begins to send data, it drives enable signal ENA high, causing pre-driver 114 to generate VOB+, VOB− with the equalized, limited data buffered from VIN+, VIN−. VBIASN can be switched with the enable signal, such as by ANDing ENA with a bias voltage to generate VBIASN.

When VBIASN is more than a threshold above ground, it turns on n-channel bias transistors 82-85, allowing them to conduct current. Select transistors 72-75 are turned on by select signals S0, S1, S2, S3, allowing the amount of sink current to be programmable by S0:3. Signals S0:3 may be programmed into a register in the redriver chip, or may be external signal pins. The sizes of select transistors 72-75 and bias transistors 82-85 may differ to allow for more variation in selectable current.

Data signal VOB+ is applied to the gate of n-channel differential transistor 40, while VOB− is applied to the gate of n-channel differential transistor 42. The sources of differential transistors 40, 42 are connected together and to a current sink of parallel transistors legs that can be selectively enabled to select the sink current. Select transistors 72-75 and bias transistors 82-85 form the current sink.

The signal data on VOB+, VOB− cause current to be switched between VOUT+, VOUT−, which are the drains of differential transistors 40, 42, respectively. When VOB+ goes high and VOB− goes low, differential transistor 40 conducts more current, driving VOUT− lower. Differential transistor 42 conducts less current, allowing termination resistor 46 to drive VOUT+ higher.

Figure 6:
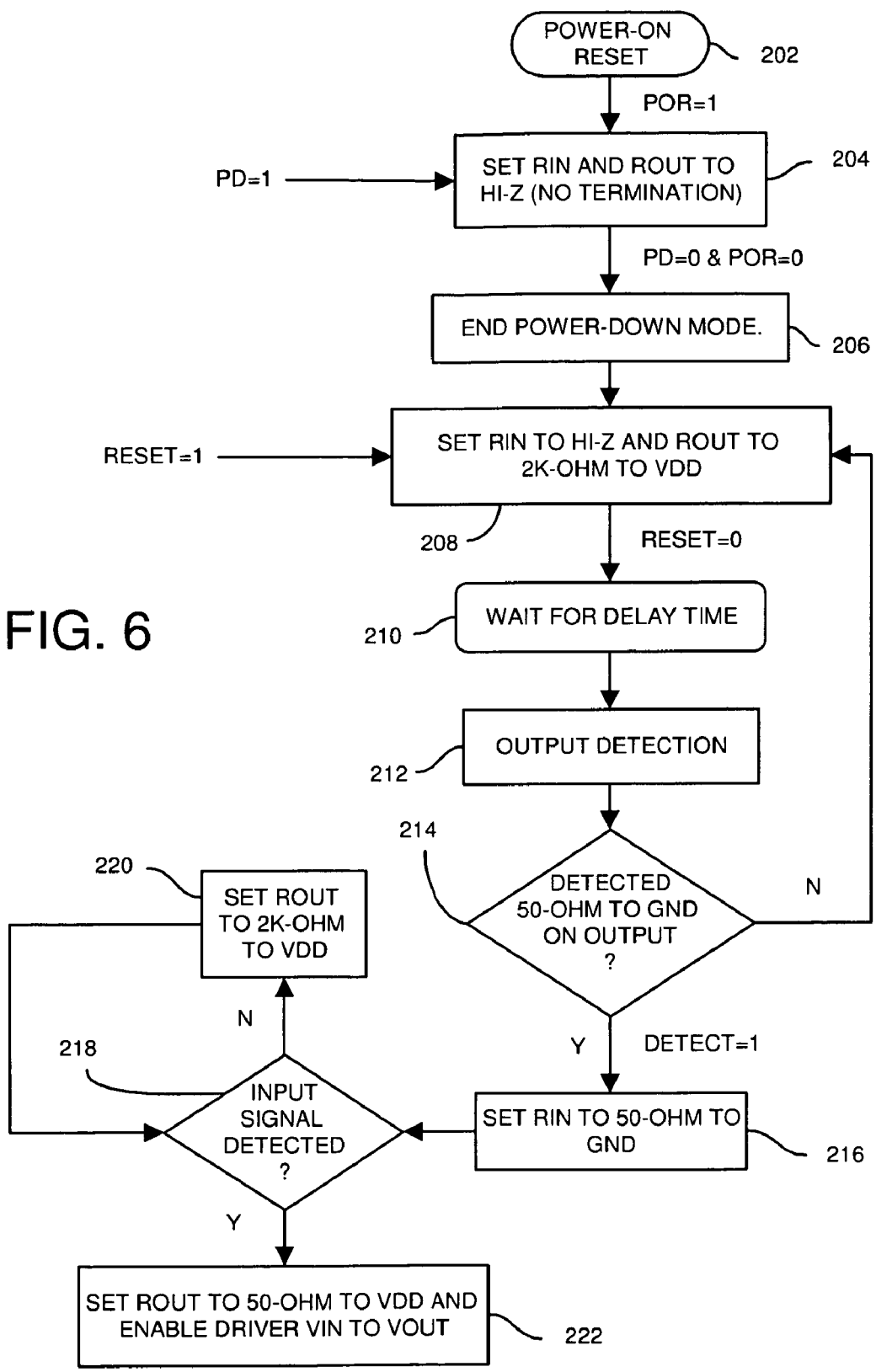
FIG. 6 is a flowchart of operation of far-end termination detection and switched input and output termination of the redriver chip.

FIG. 6 is a flowchart of operation of far-end termination detection and switched input and output termination of the redriver chip. When a power-on reset is detected, step 202, then POR=1. Both the input and output terminations are disconnected, step 204, or Rin=HiZ, Rout=HiZ. When power down mode is activated, such as by asserting an external pin to the redriver chip, PD=1 and step 204 is entered.

Once power-down mode is de-asserted and the power-on reset is over, PD=0 and POR=0, and the power-down mode ends, step 206. The input termination remains disconnected (Rin=HiZ), but the output termination is switched to the 2K-ohm resistor to VDD (Rout=2K), step 208. Step 208 is also entered when an external reset is applied. Once reset is not asserted, the redriver chip waits for a delay time, step 210. This can be the delay time set by delay line 88 (FIG. 3) or may be shifted in time.

After the delay time, output termination detection occurs to detect the far-end termination connected to VOUT+, VOUT−, step 212. When output detector 110 does not detect an external 50-ohm to ground termination on the far end of VOUT+, VOUT−, step 214, the switched output termination remains at 2K to ground, the input termination remains disconnected, and the reset state, step 208, is entered again. Detection can be repeated continuously or periodically, such as once each second, millisecond, or other periods of time.

When output detector 110 detects an external 50-ohm to ground termination on the far end of VOUT+, VOUT−, step 214, the NHIZ signal from output detector 110 to switched input termination 104 is driven low, causing 104 to connect the 50-ohm to ground termination to VIN+, VIN−, step 216. Rin=50 Ohm to ground. The output impedance remains at 2K to VDD, but the detected termination on VOUT+, VOUT− is mirrored to VIN+, VIN−.

Input signal detector 106 examines VIN+, VIN− and detects when these signals begin switching, such as when an upstream transmitter begins transmitting. When input signaling on VIN+, VIN− is detected, step 218, the output termination changed to 50-ohm to VDD (Rout=50 to VDD) to provide better termination for signaling on VOUT+, VOUT− as the signals on VIN+, VIN− are passed through the redriver chip. The pre-driver and output stages are enabled to pass data through from VIN+, VIN− to VOUT+, VOUT− step 222.

When no input signaling on VIN+, VIN− is detected, step 218, the output termination remains at 2K-ohm to VDD (Rout=2K-Ohm to VDD) to provide lower power consumption. The pre-driver and output stages remain disabled to conserve power. Input signal detector 106 can continue to check for signaling on VIN+, VIN− until the transmitter begins signaling, step 218.

When signaling stops for some period of time, the output termination may return to 2K-ohm to VDD and the pre-driver and output stages may be disabled to conserve power. Alternately, the 50-ohm termination may remain until the reset signal is activated, causing step 208 to be entered and the process repeated.

Alternate Embodiments

Several other embodiments are contemplated by the inventors. For example, one variation includes a cable unplug detector at the output to sense the presence of a cable connected between the output and the far-end receiver termination by detecting the output swing with or without the far-end receiver termination. Without the far-end receiver termination, the output swing will be about double that of the normal operation, and when it senses the cable is unplugged, it re-enters the receiver detection cycle.

Output detector 110 may sense only one signal, such as VOUT+ and not VOUT−, or may sense both VOUT+, VOUT−. Several re-driver chips could be connected in series between a transmitter chip and a receiver chip, using several segments. Each re-driver chip can sense the downstream termination and mirror the termination to the next upstream device.

While a 50-ohm to ground termination has been described, other values could be used. Actual systems may slightly adjust the 50-ohm value, such as by using 45-ohm resistors and assuming 5 ohms of wiring or other resistance. Resistor values could be selected empirically for the system to best tune the observed waveforms. Some buses may use other termination, such as 75-ohm to ground, 20-ohms, or other values. Rather than termination to ground, termination could be to VDD or to an intermediate voltage such as VDD/2. The switched output termination circuit could be inverted for systems with termination to power, and sensing in output detector 110 could be changed, such as by adding inverter before AND gates 76, 78.

Far-end termination detection may be disabled, such as by a bit in a programmable register, or by an external mode signal. Other components such as capacitors, resistors, buffers, and transistors may be added. Inversions may be added using inverters or by swapping differential lines. Many choices for transistor device sizes and resistor values could be made. Additional stages could be added. A bias-voltage generator could be used to generate VBIASN, or an external bias voltage used. Input and output buffers and drivers could be added. The sensitivity and switching threshold of detectors may be adjusted by varying ratios of transistor sizes.

More complex termination may be substituted. Filter capacitors or resistor networks may be used. While a transmitter chip, a receiver chip, and a redriver chip have been described, each could be partitioned to several chips, dice, modules, or packages. A state machine, programmable logic, random logic, firmware, or various combinations may implement the procedure shown in FIG. 6.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:
1. A redriver device comprising:
a differential input including a true differential input and a complement differential input, the true and complement differential inputs being driven to opposite states by a remote transmitter transmitting data;
a differential output including a true differential output and a complement differential output, the true and complement differential outputs being driven to opposite states by the redriver device when re-transmitting data to a remote receiver;
a differential redriving circuit, coupled to the differential input, for re-driving data sent by the remote transmitter onto the differential output as re-transmitted data; and
an output detector, coupled to the differential output, for detecting a far-end termination on the remote receiver and activating a detect signal in response to detection of the far-end termination;
a true switched input termination resistor, coupled to the true differential input in response to the detect signal being activated, and disconnected from the true differential input in response to the detect signal not being activated; and
a complement switched input termination resistor, coupled to the complement differential input in response to the detect signal being activated, and disconnected from the complement differential input in response to the detect signal not being activated;
wherein the true switched input termination resistor and the complement switched input termination resistor pro- vide termination to the remote transmitter when the output detector detects the far-end termination on the remote receiver;

wherein the differential redriving circuit further comprises:

an equalizer that shapes a waveform of the data received over the differential input to generate equalized data;

a pre-driver that receives the equalized data from the equalizer and generates buffered data;

an output stage that receives the buffered data from the pre-driver and drives current onto the true differential output and onto the complement differential output;

wherein the differential output comprises a true line and a complement line that are driven by the differential redriving circuit in opposite directions to indicate data in the re-driven signal;

a first external coupling capacitor coupled between the differential redriving circuit and the remote receiver on the true line of the differential output; and a second external coupling capacitor coupled between the differential redriving circuit and the remote receiver on the complement line of the differential output;

wherein the first external coupling capacitor prevents D.C. current flow on the true line between the redriver device and the remote receiver;

wherein the second external coupling capacitor prevents D.C. current flow on the complement line between the redriver device and the remote receiver, whereby the far-end termination on the remote receiver is detected by the redriver device and whereby the far-end termination on the remote receiver is mirrored to the remote transmitter by the true switched input termination resistor and the complement switched input termination resistor on the differential input of the redriver device.

2. The redriver device of claim 1 further comprising:

a true input termination transistor, coupled in series with the true switched input termination resistor, for blocking current flow through the true switched input termination resistor when the detect signal is not activated, and for conducting current through the true switched input termination resistor when the detect signal is activated; and a complement input termination transistor, coupled in series with the complement switched input termination resistor, for blocking current flow through the complement switched input termination resistor when the detect signal is not activated, and for conducting current through the complement switched input termination resistor when the detect signal is activated.

3. The redriver device of claim 2 wherein the true input termination transistor and the true switched input termination resistor are connected in series between the true differential input and a ground;

wherein the complement input termination transistor and the complement switched input termination resistor are connected in series between the complement differential input and the ground.

4. The redriver device of claim 1 wherein the output detector detects a D.C. voltage on the differential output that depends on a charging time of the first external coupling capacitor;

wherein the charging time is greater when the far-end termination is enabled on the remote receiver than when the far-end termination is not enabled on the remote receiver.

5. The redriver device of claim 1 wherein the output detector further comprises:

a pulse generator that generates a pulse;

a delay circuit that generates a delayed pulse;

a true compare gate that receives the true differential output and generates a true detect signal when the true differential output is below a compare voltage;

a complement compare gate that receives the complement differential output and generates a complement detect signal when the complement differential output is below a compare voltage;

a combining gate that combines the true detect signal and the complement detect signal to generate a combined detect signal; and a flip-flop that receives the delayed pulse as a clock, and samples the combined detect signal in response to the delayed pulse to generate the detect signal.

6. The redriver device of claim 5 wherein the pulse generator is activated by a reset signal or detection of power being applied to the redriver device.

7. The redriver device of claim 1 further comprising:

a input signal detector, coupled to the differential input, for activating a signal-detect signal when the true differential input and the complement differential input are varying in voltage to carry the data sent from the remote transmitter;

a true switched output termination resistor, coupled to the true differential output in response to the signal-detect signal being activated, and disconnected from the true differential output in response to the signal-detect signal not being activated;

a complement switched output termination resistor, coupled to the complement differential output in response to the signal-detect signal being activated, and disconnected from the complement differential output in response to the signal-detect signal not being activated;

whereby output termination is switched to the differential output in response to the signal-detect signal from the input signal detector.

8. The redriver device of claim 7 further comprising:

a true switched output-sensing termination resistor, coupled to the true differential output in response to an evaluation signal being activated, and disconnected from the true differential output in response to the evaluation signal not being activated;

a complement switched output-sensing termination resistor, coupled to the complement differential output in response to the evaluation signal being activated, and disconnected from the complement differential output in response to the evaluation signal not being activated;

wherein the evaluation signal is activated when the output detector detects the far-end termination.

9. The redriver device of claim 1 wherein the differential redriving circuit further comprises:

a limiter that clips voltages of the equalized data.

10. A method for mirroring detected far-end termination on a receiver to an input connected to a transmitter comprising:

disconnecting an input termination resistance from an input to a redriver chip inserted between the transmitter and the receiver to set an input impedance of the input to a high-impedance state;

disconnecting a first output termination resistance and a second output termination resistance from an output to the redriver chip inserted between the transmitter and the receiver to set an output impedance of the output to the high-impedance state;

connecting the first output termination resistance to the output to set the output impedance to a first low-impedance state;

waiting for a period of time to elapse after connecting the first output termination resistance to the output;

sensing the output to detect when a far-end termination is connected to the receiver and activating a detect signal when detected; and when the detect signal is activated, connecting the input termination resistance to the input to minor the far-end termination on the receiver to be visible to the transmitter;

wherein the input impedance is set to a low-impedance state to minor the far-end termination on the receiver for signaling.

11. The method of claim 10 further comprising:

sensing the input to detect when the transmitter is varying the input to send transmission signals to the receiver and activating an input-sensed signal when detected;

when the input-sensed signal is activated, connecting the second output termination resistance to the output and redriving the transmission signals received by the input to the output for re-transmission to the receiver to set the output impedance to a second low-impedance state.

12. The method of claim 11 further comprising:

when the input-sensed signal is activated, disconnecting the first output termination resistance to the output for replacement by the second output termination resistance;

wherein the second low-impedance state has a higher impedance than the first low-impedance state, wherein impedance is lowered when the input-sensed signal is activated.

13. The method of claim 10 wherein sensing the output to detect when a far-end termination is connected to the receiver comprises:

using the first output termination resistance to charge a coupling capacitor coupled between the output and the far-end termination on the receiver;

after the period of time, comparing a voltage of the output to a threshold voltage to detect when the coupling capacitor has been rapidly charged and when the coupling capacitor has been slowly charged; and when the coupling capacitor has been slowly charged, activating the detect signal.

14. The method of claim 13 wherein connecting the first output termination resistance to the output comprises turning on a first transistor in series with the first output termination resistance between the output and a power supply;

wherein connecting the second output termination resistance to the output comprises turning on a second transistor in series with the second output termination resistance between the output and the power supply;

wherein connecting the input termination resistance to the input comprises turning on a third transistor in series with the input termination resistance between the input and a ground.

15. A differential redriver comprising:

a differential input having a true input line and a complement input line that are driven in opposite directions by a remote transmitter;

a differential output having a true output line and a complement output line;

wherein the true output line is coupled to a true input of a remote receiver through a true coupling capacitor;

wherein the complement output line is coupled to a complement input of the remote receiver through a complement coupling capacitor;

an equalizer that shapes a waveform of data received over the differential input to generate equalized data;

a pre-driver that receives the equalized data from the equalizer and generates buffered data;

an output stage that receives the buffered data from the pre-driver and drives current onto the true output line and onto the complement output line;

output sensing means for sensing the differential output to detect when a far-end termination is connected to the remote receiver and for activating a detect signal when detected;

a true input resistor for selectively mirroring the far-end termination back to the remote transmitter;

a complement input resistor for selectively minoring the far-end termination back to the remote transmitter;

a true input transistor connected in series with the true input resistor between the true input line and a ground, wherein a gate of the true input transistor is controlled by the detect signal; and a complement input transistor connected in series with the complement input resistor between the complement input line and a ground, wherein a gate of the complement input transistor is controlled by the detect signal;

whereby when the detect signal is activated, input termination is connected to the differential input to minor the far-end termination on the remote receiver to be visible to the remote transmitter.

16. The differential redriver of claim 15 wherein the output stage comprises:

a current sink from a source node to a ground;

a true differential transistor receiving a true buffered data signal from the pre-driver on a gate, and has a source connected to the source node and a drain connected to the true output line;

a true termination resistor connected between the true output line and a first node;

a true switching transistor having a channel between the first node and a power supply, and a gate driven by a first control signal;

a true sensing resistor connected between the true output line and a second node;

a true sensing transistor having a channel connected between the second node and the power supply, and a gate driven by a second control signal;

a complement termination resistor connected between the complement output line and a third node;

a complement switching transistor having a channel between the third node and the power supply, and a gate driven by the first control signal;

a complement sensing resistor connected between the complement output line and a fourth node;

a complement sensing transistor having a channel connected between the fourth node and the power supply, and a gate driven by the second control signal;

wherein the second control signal is activated by the output sensing means when sensing the differential output to detect when a far-end termination;

input sensing means for sensing the differential input to detect when the remote transmitter is varying the differential input to send data to the remote receiver and activating the first control signal when detected;

wherein the first control signal is activated to connect sensing resistors to allow the output sensing means to sense the differential output for the far-end termination.

17. The differential redriver of claim 16 further comprising:
- an enable signal, generated by the input sensing means, for enabling the output stage when the first control signal is activated, and for powering down the output stage when the first control signal is not activated;
- wherein the true termination resistor and the complement termination resistor are about 50 ohms;
- wherein the true sensing resistor and the complement sensing resistor are about 2K ohms;
- wherein the differential output is initially in a high-impedance state, then in a state of 2K-ohm impedance when the output sensing means is active, and then in a 50-ohm impedance state when the remote transmitter is varying the differential input to send data to the remote receiver,
- whereby the differential output has three impedance states.

\* \* \* \* \*